(12) United States Patent
Tansho et al.

(10) Patent No.: US 6,813,103 B2
(45) Date of Patent: Nov. 2, 2004

(54) PRODUCING METHOD OF IMAGE PICKUP DEVICE

(75) Inventors: Kazuo Tansho, Hachioji (JP); Masafumi Mizukami, Hachioji (JP); Nobuhiro Saruya, Hachioji (JP); Yuichi Atarashi, Hachioji (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/397,226

(22) Filed: Mar. 27, 2003

(65) Prior Publication Data

US 2003/0184885 A1 Oct. 2, 2003

(30) Foreign Application Priority Data

Apr. 2, 2002 (JP) ........................................ 2002-100327

(51) Int. Cl.[7] ................................................ G02B 7/02
(52) U.S. Cl. ........................................................ 359/819
(58) Field of Search ................................ 359/819, 811; 369/44.14

(56) References Cited

U.S. PATENT DOCUMENTS

| | | | |
|---|---|---|---|
| 4,554,586 A | * 11/1985 | Tanuma et al. | 348/219.1 |
| 6,122,114 A | 9/2000 | Sudo et al. | 359/819 |
| 2001/0043280 A1 | * 11/2001 | Suda | 348/341 |
| 2004/0061799 A1 | * 4/2004 | Atarashi et al. | 348/340 |

FOREIGN PATENT DOCUMENTS

| | | | | |
|---|---|---|---|---|
| EP | 0 585 186 A2 | 3/1994 | ....... | H01L/31/0203 |
| EP | 0 773 673 A1 | 5/1997 | .......... | H04N/5/335 |
| EP | 1 347 637 A2 | 9/2003 | .......... | H04N/5/225 |
| JP | 09 312809 | 12/1997 | .......... | H04N/5/335 |
| JP | 247427 | 8/2002 | .......... | H04N/5/225 |

* cited by examiner

*Primary Examiner*—Ricky Mack
(74) *Attorney, Agent, or Firm*—Finnegan, Henderson, Farabow, Garrett & Dunner, L.L.P.

(57) ABSTRACT

A producing method for an image pickup device in which an image pickup optical unit that picks up an image of an object is provided on a base board, wherein there are provided a first process for mounting an image sensor and other electric parts on the base board and a second process for assembling the image pickup optical unit on the base board from one direction, and the first process and the second process are independent from each other.

6 Claims, 6 Drawing Sheets

PRODUCING METHOD OF IMAGE PICKUP DEVICE

BACKGROUND OF THE INVENTION

The present invention relates to an image pickup device capable of being mounted on a cellphone or on a personal computer and to a producing method of the image pickup device.

With high efficiency and downsizing of image pickup devices in recent years, a cellphone and a personal computer each being provided with an image pickup device are spreading.

In the conventional image pickup device of this kind, there are provided electric parts such as a capacitor and a resistance, and an image sensor connected to an image processing IC circuit, on base board PC which is of glass epoxy, for example, and there is further arranged an image pickup optical unit having therein an optical member composed of a lens and an outer frame member that supports the optical member. The image pickup, device of this kind is produced when each part is incorporated by a robot that conducts automatic production on base board PC.

Incidentally, because of high correlation with assembly processing of other parts such as an image sensor and electric parts for assembly of an image pickup optical unit in the producing process of the image pickup device stated above, when sizes and shapes of other parts such as base board PC, or an image sensor and electric parts, for example, are changed, an assembling method for the image pickup optical unit must also be changed accordingly, resulting in requirement for readjustment of machinery for production of image pickup devices and for installation of new facilities. Thus, labor and cost have been required by production of image pickup devices.

SUMMARY OF THE INVENTION

An object of the invention is to provide a producing method of an image pickup device, the producing method being capable of reducing labor and cost.

The object mentioned above can be attained by either one of the following Structures (1)–(6).

Structure (1): A producing method for an image pickup device in which an image pickup optical unit that picks up an image of an object is provided on a base board, wherein there are provided a first process for mounting an image sensor and other electric parts on the base board and a second process for assembling the image pickup optical unit on the base board from one direction, and the first process and the second process are independent from each other.

In the Structure (1), since the first process for mounting an image sensor and other electric parts on the base board and the second process for assembling the image pickup optical unit on the base board from one direction are independent from each other, even when changes in operations in the first process or changes in parts are made, the image pickup optical unit can be assembled in the same process, and neither preparation of new facilities for assembling nor readjustment is required. Therefore, it is possible to save labor and cost in production of image pickup devices.

To be more concrete, the second process can be carried out independently without being affected by the first process because the image pickup optical unit can be assembled from only one direction. Therefore, the image pickup devices can be produced on the same line independently of a type of the base board, which makes it possible to save labor and cost in production of image pickup devices.

Structure (2): The producing method for an image pickup device according to the Structure (1) wherein the image pickup optical unit is equipped with an outer frame member, an optical member for converging light on the image sensor and a pressing member that presses the optical member, and the second process has therein an outer frame member fixing process to fix the outer frame member on the base board in the direction perpendicular to an image pickup surface of the image sensor so that the image sensor may be covered, an optical member contact process to bring the optical member into contact with the base board or with the image sensor in the direction perpendicular to the image pickup surface of the image sensor, and a pressing member fixing process to fix the pressing member on the outer frame member in the direction perpendicular to the image pickup surface of the image sensor so that the optical member may be pressed by a prescribed pressing force.

In the Structure (2), the same effects as in Structure (1) are naturally obtained, and in particular, the outer frame member is fixed on the base board so that the image sensor may be enclosed in the outer frame member fixing process in the second process, the optical member is brought into contact with the base board or with the image sensor in the direction perpendicular to an image pickup surface of the image sensor in the optical member contact process and the pressing member is fixed on the outer frame member so that the optical member may be pressed by a prescribed force in the direction perpendicular to an image pickup surface of the image sensor in the pressing member fixing process. Thus, assembling can be carried out in the direction perpendicular to an image pickup surface of the image sensor, which makes operations to be easy. Further, since the optical member is regulated in terms of movement in the direction of an optical axis by the pressing member to be fixed on the outer frame member, operations for positioning the optical member on the outer frame member are easy. Thus, it is possible to produce highly accurate image pickup devices while making the first process and the second process to be independent of each other.

Structure (3): The producing method of an image pickup device according to the Structure (2) wherein the optical member is provided with an interfitted portion that is engages with the outer frame member and is prevented from rotating around an optical axis as the center, the outer frame member is provided with an interfitting portion that is engaged with the interfitted portion, and the optical member contact process has a process to make the interfitted portion of the optical member to be fitted in the interfitting portion in the direction perpendicular to the image pickup surface of the image sensor.

In the Structure (3), the same effects as in Structure (2) are naturally obtained, and in particular, a movement of the optical member in the direction of rotation around an optical axis can be regulated, and therefore, highly accurate image pickup devices can be produced easily without fine adjustment such as positioning for the image sensor, because the optical member is provided with the interfitted portion that is engages with the outer frame member and is prevented from rotating around an optical axis as the center, the outer frame member is provided with an interfitting portion that is engaged with the interfitted portion, and the interfitted portion of the optical member is fitted in the interfitting portion in the direction perpendicular to the image pickup surface of the image sensor in the optical member contact process.

Structure (4): The producing method of an image pickup device according to the Structure (2) or Structure (3) wherein the first process includes a process to attach the electric parts at the location that is between the adhesion part of the base board where the outer frame member is fixed and the image sensor, and is closer to the adhesion part of the base board.

In the Structure (4), the same effects as in Structure (1) or Structure (2) are naturally obtained, and in particular, it is possible to use electric parts as indicators, when attaching the outer frame member on the base board in the second process, because the electric parts are attached at the location that is between the adhesion part of the base board and the image sensor and is closer to the adhesion part of the base board, in the first process. Therefore, the outer frame member can be mounted accurately without fine setting and adjustment for attaching it, which makes it possible to save labor and cost in production of image pickup devices.

Structure (5): The producing method of an image pickup device according to either one of the Structures (2)–(3) wherein the outer frame member fixing process fixes the outer frame member on the base board after bringing the outer frame member into contact with the electric parts.

In the Structure (5), the same effects as in Structures (2)–(4) are naturally obtained, and the outer frame member can be moved roughly in relatively prompt operations until it comes in contact with electric parts, because the outer frame member is fixed on the base board after being brought into contact with the electric parts in the outer frame member fixing process, thus it is possible to conduct positioning operations for the outer frame member promptly. Therefore, the outer frame member can be mounted accurately without careful setting and adjustment for operations to fix the outer frame member, which makes it possible to save cost and labor in production of image pickup devices.

Structure (6): The producing method of an image pickup device according to the Structures (2)–(5) wherein the outer frame member fixing process has therein a process to coat an adhesive composed of a resin of a compound hardening type having both a property to be hardened by ultraviolet radiation and a property to be hardened by a prescribed hardening means which is different from the ultraviolet radiation on an adhesion part of the outer frame member and the base board, a temporal fixing process to harden the adhesion part with ultraviolet radiation for temporal fixing, and a regular fixing process to harden by the prescribed hardening means to conduct regular fixing after conducting the optical member contact process and the pressing member fixing process.

In the Structure (6), the same effects as in Structures (2)–(5) are naturally obtained, and in particular, it is possible to harden the adhesive to a certain extent for temporal fixing and thereby to advance to the following assembly process without waiting until the adhesive is hardened thoroughly, when fixing the outer frame member on the base board, because a process to coat the adhesive composed of the resin of a compound hardening type having both a property to be hardened by ultraviolet radiation and a property to be hardened by a prescribed hardening means which is different from the ultraviolet radiation on an adhesion part between the outer frame member and the base board, a temporal fixing process to harden the adhesion part with ultraviolet radiation for temporal fixing, and a regular fixing process to harden by a prescribed hardening means to conduct regular fixing after conducting the optical member contact process and the pressing member fixing process, are conducted in the outer frame member fixing process. It is therefore possible to shorten a cycle time for production of image pickup devices, and thereby to improve productivity.

Further, it is possible to prevent that a position of the outer frame member is shifted between the optical member contact process and the pressing member fixing process, and to adjust again in the case of regular fixing process, which makes it possible to produce a highly accurate image pickup device.

BRIEF DESCRIPTION OF THE DRAWINGS

Each of FIGS. 7(a)–7(d) is a diagram illustrating a producing process of image pickup devices.

Each of FIGS. 8(a)–8(c) is a diagram illustrating another producing process of image pickup devices.

DETAILED DESCRIPTION OF THE PREFERRED EMBODIMENT

An embodiment of the invention will be explained in detail as follows, referring to the drawings.

Figure 1:
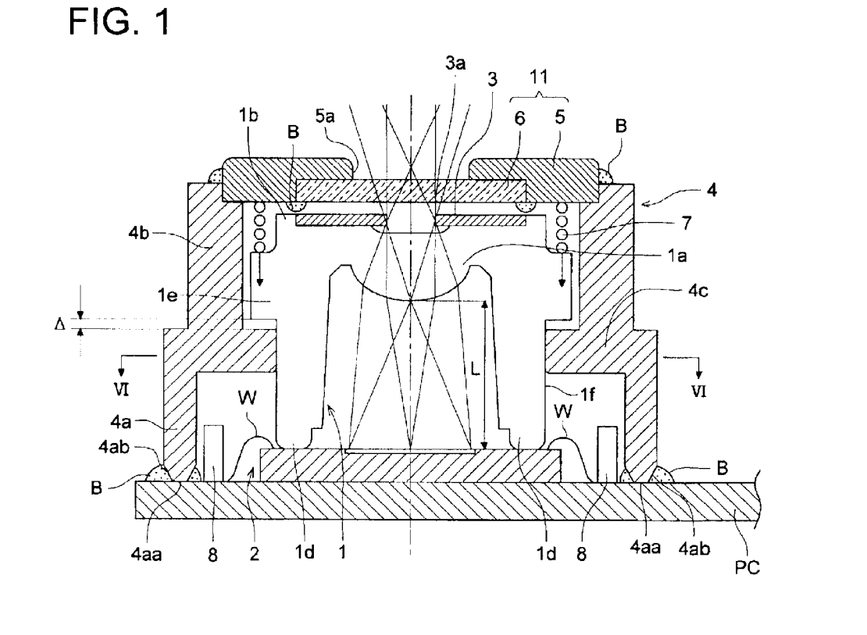
FIG. 1 is a sectional view of an image pickup device relating to the invention.
Figure 2:
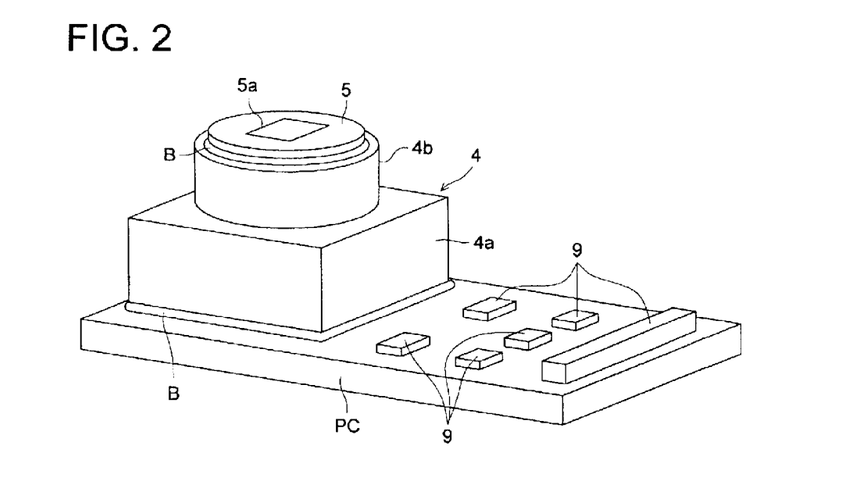
FIG. 2 is a perspective view of the image pickup device shown in FIG. 1.
Figure 3:
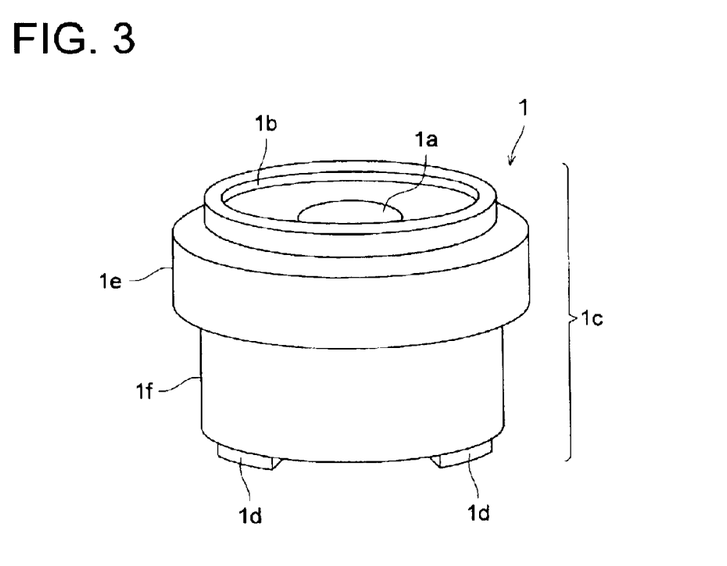
FIG. 3 is a perspective view of an optical member.
Figure 4:
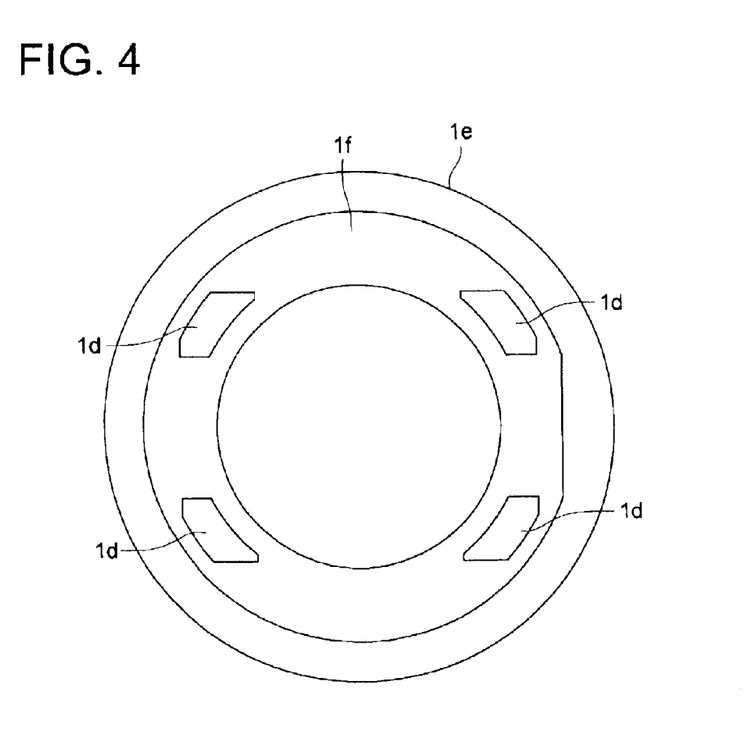
FIG. 4 is a bottom surface view of an optical member.
Figure 5:
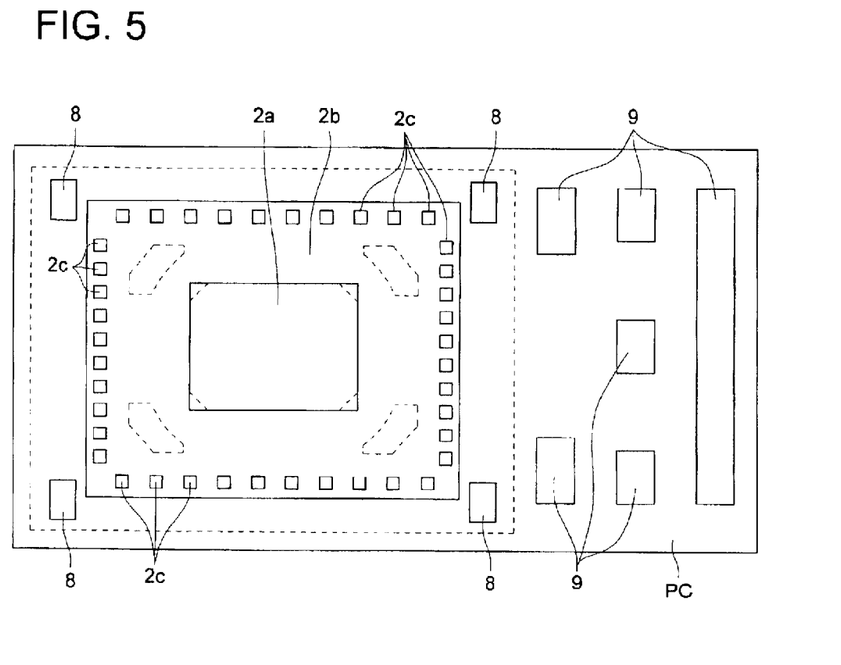
FIG. 5 is a top surface view of an image sensor.
Figure 6:
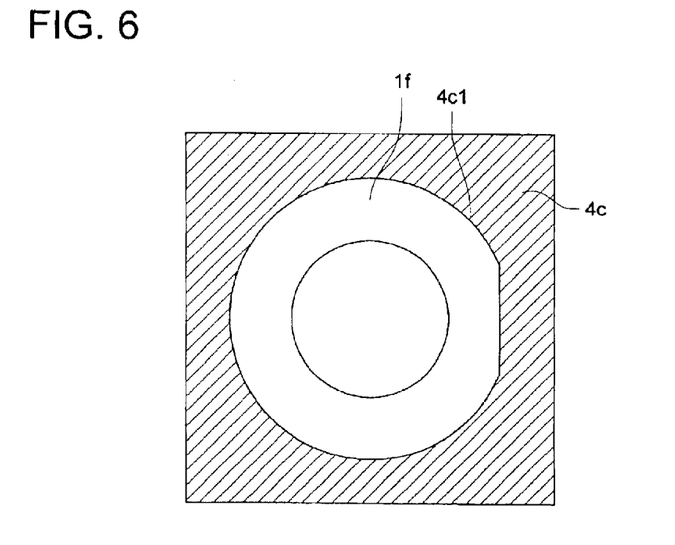
FIG. 6 is a sectional view taken on line VI—VI in FIG. 1.

FIG. 1 is a sectional view of an image pickup device relating to the invention. FIG. 2 is a perspective view of the image pickup device in FIG. 1. FIG. 3 is a perspective view of optical member 1 and FIG. 4 is a bottom face view of optical member 1. FIG. 5 is a top face view of image sensor 2. FIG. 6 is a sectional view taken on line VI—VI in FIG. 1.

As shown in FIGS. 1 and 2, image pickup device 10 is composed of base board PC, optical member 1, image sensor 2, diaphragm plate 3, lens frame 4, light shielding plate 5, filter 6, pressing member 7, positioning electric parts 8 and electric parts 9 arranged on the base board PC.

Incidentally, image pickup optical unit 20 is composed of optical member 1, diaphragm plate 3, lens frame 4, light-shielding plate 5, filter 6 and pressing member 7.

The optical member 1 is made of transparent plastic material, and as shown in FIGS. 3 and 4, tubular leg portion 1c and convex-lens-formed lens portion 1a supported by the leg portion 1c are formed integrally in the optical member 1. The leg portion 1c has therein four contact portions 1d, upper leg portion 1e formed on a circumference on the upper end of the optical member 1, board-shaped top face portion 1b that closes the top end and lower leg portion 1f that is formed between the contact portions 1d and the upper leg portion 1e, and the lens portion 1a is formed at the center of the top face portion 1b.

The lower leg portion (interfitted portion) 1f is almost in a D-shaped form that is formed by an arc representing the interfitting portion in terms of a shape and by a chord connecting both ends of the arc on a horizontal plane.

Further, the diaphragm plate 3 which is made of material having a light-shielding property and has aperture 3a representing the first diaphragm that prescribes f-number of the convex lens portion 1a is fixed with an adhesive on a circumference of the lens portion 1a on the upper part of the top face portion 1b.

Outside the optical member 1, there is arranged lens frame 4 representing an outer frame member made of material having lighttightness. On the lens frame 4, there are provided prismatic lower portion 4a and cylindrical upper portion 4b, as is apparent from FIG. 2. A lower end portion of the lower portion 4a is a place of adhesion for the lens frame 4 to be attached on the base board PC, and as shown in FIG. 1, an inner side surface and an outer side surface of the lens frame 4 are cut obliquely toward bottom surface 4aa at a prescribed angle, and thus, chamfered portions 4ab and 4ab each having a slanting surface are formed respectively inside and outside. When the lower portion 4a of the lens frame 4 is brought into contact with base board PC to be attached thereon, an adhesive B is coated on the boundary between the base board PC and the bottom surface 4aa plus chamfered portions 4ab and 4ab to fix them.

Further, when lens frame 4 is pressed down from the upper portion to be brought into contact with base board PC that is coated thereon with the adhesive B, the lens frame can be fixed on the base board PC while preventing that bubbles are generated between the adhesive B and the lens frame 4 in the case of adhesion, because an inclined surface is formed by chamfered portions 4ab and 4ab. Due to this, the lens frame 4 can be fixed more firmly on the base board PC. In this case, the adhesive B is a resin of a compound hardening type that can be hardened by irradiation of ultraviolet radiation and by other means after being coated on an adhesion part. As other means, there are given heat, moisture, hardening agents or hardening-promoters.

On the circular inner surface of partition wall 4c on the top face of lower portion 4a, there is provided D-shaped groove (interfitting portion) 4cl that corresponds to lower leg portion 1f of the optical member 1, as shown in FIG. 6, and the lower leg portion 1f is fitted in the D-shaped groove 4cl closely. Therefore, it is possible to position the lens portion 1a to photoelectric converting portion 2a accurately in the direction perpendicular to an optical axis, only by positioning and arranging the base board PC and lens frame 4 by using, for example, an optical sensor provided in an automatic assembly machine so that the center of the circular aperture portion on the partition wall 4c and the center of photoelectric converting portion 2a of image sensor 2 described later may agree with each other.

On the other hand, light-shielding plate 5 is mounted on the top of the upper portion 4b of the lens frame 4 with the adhesive B. The light-shielding plate 5 has, on its center, aperture 5a serving as a second diaphragm. Filter 6 made of material having infrared absorption characteristics is connected to the bottom side of the aperture 5a at the center of the light-shielding plate 5, with the adhesive B.

The light-shielding plate 5 and the filter 6 constitute cover member 11. Since the base board PC, lens frame 4 and cover member 11 are joined closely each other as stated above, image pickup device 10 has a dust-proof and moisture-proof structure.

In FIG. 1, pressing member 7 constituted by an elastic member such as, for example, a coil spring is arranged between the optical member 1 and the light-shielding plate 5. When the light-shielding plate 5 is mounted on the lens frame 4, the light-shielding plate 5 presses pressing member 7, and the pressing member 7 deforms elastically. This pressing member 7 presses the optical member 1 downward in FIG. 1 with prescribed pressing force, to urge the optical member 1 to image sensor 2. In this case, when a force toward the lower image sensor 2 from the light-shielding plate 5 is applied, pressing member 7 deforms elastically, and thus, buffer action to absorb the force is operated. Therefore, the force is not transmitted directly to the image sensor 2 and damage of the sensor 2 can be prevented.

In FIG. 5, image sensor 2 is composed of a CMOS (Complementary Metal Oxide Semiconductor) type image sensor. On the top face of the base board PC, there is attached rectangular lamina-shaped image sensor 2 with its bottom surface touching the top face of the base board PC. At the center of the top face of the image sensor 2, there are arranged pixels in a two-dimensional way so that photoelectric converting portion 2a representing an image pickup surface is formed. Processing portion 2b is formed outside the photoelectric converting portion 2a, and a plurality of pads 2c are arranged in the vicinity of an outer edge of the processing portion 2b. The pad 2c representing a terminal for connection is connected to the base board PC through wire W as shown in FIG. 1. The wire W is connected to a prescribed circuit on the base board PC.

Further, contact portion 1d of the optical member 1 is protruded from the bottom end of leg portion 1c to be in a shape shown in FIG. 4, and constitutes a part of the leg portion 1c. In the present embodiment, the contact portion 1d is arranged inside pad 2c in processing portion 2b of image sensor 2 under the state that the contact portion only is in contact, as shown with dotted lines in FIG. 5. Further, the number of contact portions 1d is four, and a center of gravity of the optical member 1 comes to the center of the contact portions 1d. Therefore, it can be said that the contact portions 1d have positions and forms which make the optical axis of lens portion 1a to be perpendicular to a plane when the optical member 1 is placed individually on an optional plane. Accordingly, even when there is a slight clearance between an inner circumferential surface of lens frame 4 and an outer circumferential surface of the optical member 1, the optical axis of lens section 1a crosses photoelectric converting portion 2a of image sensor 2 at right angles when the leg portion 1c is brought into contact with processing portion 2b of image sensor 2, and images with less distortion can be obtained.

In this case, it is preferable that a load from contact portion 1d is not more than 500 g (not more than 1000 g/mm$^2$ in terms of a surface pressure) when the leg portion 1c is brought into contact with processing portion 2b, because there is a fear that image sensor 2 is damaged when this load (surface pressure) is exceeded. When blur of images caused by vibration is taken into consideration, however, it is preferable that a load from contact portion 1d is not less than 5 g. The load of this kind can be managed properly by selecting a wire diameter and the number of turns of a coil spring which is pressing member 7. The surface pressure in this case is one obtained by dividing a load applied on image sensor 2 through contact portion 1d of the optical member with an area of the surface which is in contact with contact portion 1d.

In the present embodiment, gap Δ is formed between a bottom surface of upper leg portion 1e of the optical member 1 and partition wall 4c of lower portion 4a of lens frame 4, under the condition that the contact portion 1d is in contact with processing portion 2b of image sensor 2. Therefore, distance L between the lens portion 1a and photoelectric converting portion 2a of the image sensor 2 (namely, positioning in the direction of an optical axis) can be established accurately by the length of leg portion 1c. Though the number of contact portions 1d in the present embodiment is four, it may also be one, two or three. Further, the contact portion may also be a ring-shaped one that is formed along cylindrical leg portion 1c of the optical member 1, provided that interference with pad 2c can be avoided.

Further, since optical member 1 is made of plastic material, it is also possible to reduce a deviation of a focusing position caused by a change in refractive index of lens portion 1a in the case of temperature changes. Namely, in the plastic lens, when its temperature rises, refractive index of the lens is lowered, and its focusing position is changed to be farther from the lens. Since the leg portion 1c extends when temperature rises, on the other hand, there is an effect to reduce a deviation of a focusing position. Incidentally, the optical member 1 of the present embodiment is lighter than a glass lens when their volumes are the same each other, and is excellent in terms of shock absorption characteristics, because the optical member 1 is made of plastic material whose specific gravity is relatively low. Therefore, even when image pickup device 10 is dropped accidentally, damage of image sensor 2 can be restrained to the utmost, which is an advantage.

In the case of the structure wherein optical member 1 can rotate freely in lens frame 4, contact portion 1d interferes with pad 2c, therefore, there is provided a rotation-preventing mechanism which makes it possible to assemble while regulating a rotation of the optical member 1.

To be concrete, the rotation-preventing mechanism is composed of lower leg portion (interfitted portion) 1f which is almost D-shaped representing an interfitting part that is fitted in the lens frame and of D-shaped groove (interfitting portion) 4cl that is an interfitting part in partition wall 4c of lens frame 4, as shown in FIG. 6.

Namely, when the lower portion 1f of the optical member 1 is inserted in the D-shaped groove 4cl, the optical member 1 is regulated in terms of its rotation around an optical axis, and positions on two axes in the horizontal plane can be determined. Incidentally, the rotation-preventing mechanism can take any mechanism without being limited to the lower leg portion 1f which is almost D-shaped and to the D-shaped groove 4cl, provided that the mechanism can regulate a rotation of the optical member 1 around its optical axis.

Positioning electric parts 8 are represented, for example, by a capacitor, a resistance and a diode, and they are arranged to be close to lens frame 4 between image sensor 2 on base board PC and lens frame 4 in FIG. 1. Further, a height from the PC base board to a top end portion of the positioning electric parts 8 is greater than that from the PC base board to a top end portion of the image sensor 2. In FIG. 5, four positioning electric parts 8 are arranged to surround a square inside the adherence part (a portion enclosed with broken lines to be a square in FIG. 5) of the lens frame 4. Therefore, the positioning electric parts 8 serve as an index for positioning the lens frame 4 when adhering the lens frame 4 on the base board PC. Further, the top end of the positioning electric parts 8 is higher than that of image sensor 2, which prevents that the lens frame 4 comes in contact with the image sensor 2 to damage a wire and others. Incidentally, in FIG. 5, dotted lines surrounding the outside of the positioning electric parts 8 show adhesion parts for the lens frame 4.

Incidentally, the positioning electric parts 8 have only to be electric parts which are required by image pickup device 10, without being limited, for example, to a capacitor, a resistance and a diode.

Electric parts 9 are those necessary for operating image pickup device 10, in addition to the positioning electric parts 8.

Operations of the present embodiment will be explained as follows.

Lens portion 1a of optical member 1 forms an image of an object on photoelectric converting portion 2a of image sensor 2. The image sensor 2 can convert electric signals corresponding to an amount of light received into image signals to output through pad 2c and wire W.

Further, in the present embodiment, it is possible to make adjustment about a focusing position of lens portion 1a to be unnecessary in the course of assembling, by controlling dimensional accuracy of leg portion 1c of optical member 1 (including contact portion 1d), namely, by controlling accuracy of the aforesaid distance L, because the optical member 1 is mounted on processing portion 2b of image sensor 2. Incidentally, in order to make adjustment about a focusing position to be unnecessary, it is necessary to limit a deviation between photoelectric converting portion 2a of image sensor 2 and an image point of lens portion 1a of the optical member 1 to about ±F×2P (F: f-number of a lens portion, P: pixel pitch of image sensor) in terms of air-converted length.

In the present embodiment, positions of lens portion 1a and photoelectric converting portion 2a of image sensor 2 in the direction of an optical axis can be determined by contact portion 1d of leg portion 1c of optical member 1 that comes in contact with processing portion 2b of image sensor 2. Further, when lens frame 4 is mounted on base board PC with photoelectric converting portion 2a of image sensor 2 serving as a standard for positioning, positions of lens portion 1a and photoelectric converting portion 2a of image sensor 2 in the direction perpendicular to an optical axis are determined, which makes it possible to attain high positioning accuracy at low cost.

In particular, the lens frame 4 is adhered to base board PC with the adhesive, and together with other two adhered portions, the outside of image pickup device 10 is kept to be in the state sealed hermetically so that foreign substances may not invade, thus, bad influences of foreign substances on the photoelectric converting portion 2a of image sensor 2 can be eliminated. It is preferable that the adhesive used for the foregoing have hygroscopic property. Due to this, it is possible to prevent deterioration on the surface of the image sensor 2 and on pad 2c caused by an invasion of moisture.

Since there is provided pressing member 7 that presses a top face on the step section of upper leg portion 1e of optical member 1 in the direction of an optical axis with prescribed elastic force, it is possible to press contact portion 1d against processing portion 2b of image sensor 2 with appropriate pressing force (the force corresponding to a load ranging from 5 g to 500 g) by using elastic force of the pressing member 7. Therefore, even when deformation such as a warp of the part is caused by aging changes despite easy positioning of optical member 1 and image sensor 2 in the direction of an optical axis, it is possible to urge the optical member 1 against image sensor 2 with stable elastic force, and thereby to control backlash of the optical member 1 in the case of occurrence of vibration, and further to prevent that excessive stress is caused on processing portion 2b of image sensor 2 in which a circuit is arranged, when a shock is caused. Further, when large forces such as impact forces are applied in the direction of an optical axis of lens frame 4, these forces are not transmitted directly to the image sensor 2 though they are transmitted to base board PC, which is preferable from the viewpoint of protection of the image sensor 2. Incidentally, as a pressing member, an elastic member such as, for example, a coil spring is used. In addition, urethane or sponge may also be used, but an elastic material which is of resin or metal that can exhibit stable elastic force for a long time is preferable.

Since the cover member 11 composed of light-shielding plate 5 and filter 6 is arranged to be closer to an object than from lens portion 1a, the lens portion 1a is not exposed to the outside to be protected, and sticking of foreign substances to the lens surface is prevented. Further, filter 6 is made of substances having infrared absorption characteristics, and it is not necessary to provide an infrared blocking filter separately, and thereby the number of parts can be reduced, which is preferable. In place of giving infrared blocking characteristics to filter 6, it is considered to form optical member 1 itself with material having infrared absorption characteristics or to coat a film having infrared blocking characteristics on the surface of lens portion 1a.

Further, in the course of assembling, optical member 1 can be inserted in lens frame 4 from the object side, under the condition that light-shielding plate 5 is taken out of lens frame 4, and then, the light-shielding plate 5 can be mounted on the lens frame 4. Due to the structure of this kind, incorporation of the optical member 1 is improved, and automatic assembly can be carried out easily. If an air-escape vent is formed on either one of lower portions 4a of lens frame 4 in this case, it is possible to conduct assembling easily even if the gap between the lens frame 4 and the optical member 1 is small. However, it is preferable to fill this air-escape vent with fillers after assembling so that invasion of foreign substances from the outside and surface deterioration of image sensor 2 and pad 2c may be controlled. Further, it is preferable that the fillers have light-shielding properties so that they may restrain light leakage. Incidentally, it is possible to insert the optical member 1 after the lens frame 4 has been glued on the base board PC, or it is possible to mount the optical member 1 on the lens frame 4 first and then, to glue the unit of the optical member 1 and the lens frame 4 on the base board PC, by which the degree of freedom of the process can be secured. In the case of the latter assembly, partition wall 4c of the lens frame 4 can also serve as the function to prevent falling out of the optical member 1.

Next, a producing method of image pickup device 10 that is structured and operates as stated above will be explained as follows, referring to FIG. 7 which is a diagram for illustrating processes for the producing method of image pickup device 10 in succession.

As a first process of production of image pickup device 10, positioning part 8, electric part 9 and image sensor 2 are mounted on each of plural base boards PC which form aggregate base board P composed of a plurality of successional base boards PC which are not cut in piece yet.

Figure 7A:
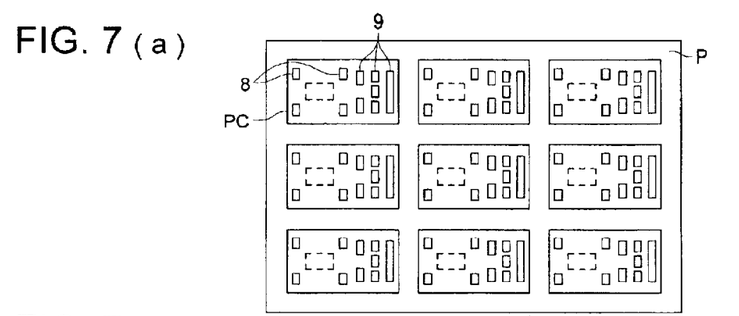

To be concrete, as an initial step in the first process, positioning electric part 8 is soldered on each base board PC of aggregate base board P shown in FIGS. 7(a)–7(d), to be within an arrangement range of lens frame 4 and to be outside of an arrangement of image sensor 2 as shown in FIG. 5, and other electric part 9 is mounted at its prescribed position, results of which are shown in FIG. 7(a).

As a succeeding step in the first process, image sensor 2 is constructed on each base board PC on the aggregate base board P. In concrete terms, silicone wafers are cut into small cubes first, and then, an image sensor of a CMOS type constituting image sensor 2 is taken out of the silicone wafers. Then, an adhesive such as silver paste, for example, are coated at a prescribed position on base board PC. After that, an image sensor of a CMOS type is pasted at a prescribed position. Then, the silver paste is hardened for adhesion. Next, wire W is subjected to wire bonding to connect pad 2c of image sensor 2 with a prescribed circuit on base board PC, which results in the state shown in FIG. 7(b), and connection processing between the image sensor 2 and the base board PC is terminated.

Figure 7B:
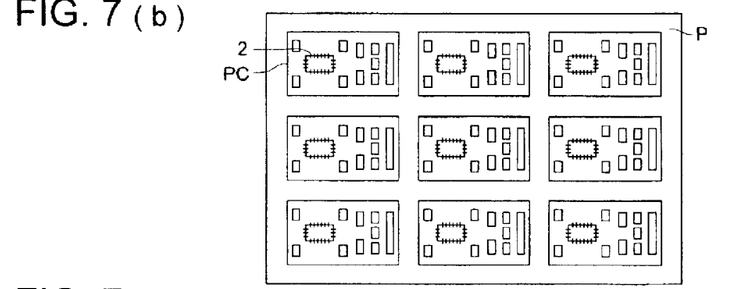
Figure 7C:
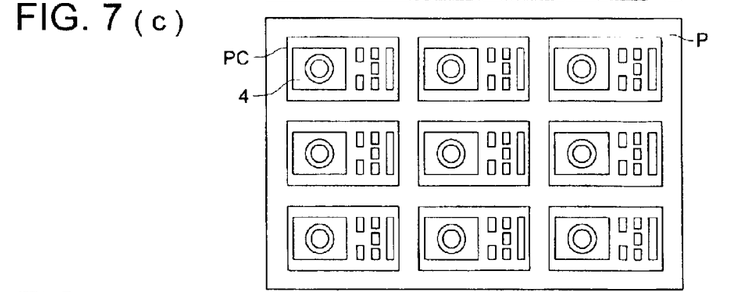

Then, as a second process, operations to assemble image pickup optical unit 20 on base board PC are conducted.

Specifically, as an initial step in the second process, the adhesive B are coated at a part of adhesion with lens frame 4 shown with dotted lines enclosing positioning electric part 8 in FIG. 5, on base board PC.

After that, lens frame 4 on base board PC is positioned, while confirming an adhesion part by bringing lower portion 4a of lens frame 4 into contact with the positioning electric part 8 on base board PC from the upper portion. Specifically, positioning is conducted so that the center of a circular aperture portion of partition wall 4c and the center of photoelectric converting portion 2a of image sensor 2 may agree with each other, by using, for example, an optical sensor provided on an automatic assembling machine (FIG. 7(c)). Then, ultraviolet radiation is applied on the adhesion part between the base board PC and lens frame 4. Owing to this irradiation of ultraviolet radiation, the adhesive B is hardened slightly, and lens frame 4 is fixed temporarily (temporal fixing process). Intensity of ultraviolet radiation applied and a period of time of irradiation may be established properly, depending on a type and an amount of use of the adhesive to be used and on an extent of desired hardening.

Figure 7D:
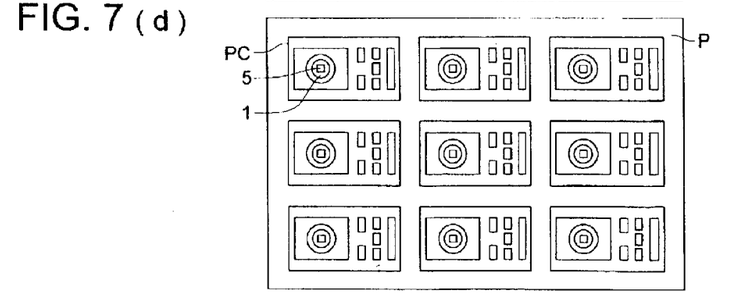

Next, as a succeeding step in the second process, two axes in the horizontal direction of optical member 1 are positioned by inserting lower portion 1f of optical member 1 in D-shaped groove 4cl formed at an interfitting portion of partition wall 4c of lens frame 4, from the upper portion of lens frame 4, results of which are shown in FIG. 7(d).

Then, contact portion 1d is brought into contact with image sensor 2 on base board PC. Then, light-shielding plate 5 is engaged with upper portion 4b of lens frame 4 after pressing member 7 is placed on the upper side of optical member 1, and the light-shielding plate 5 and the lens frame 4 are fixed together temporarily with the adhesive B.

Further, filter 6 is mounted on aperture portion 5a of light-shielding plate 5 and is fixed with the adhesive B. After these constituent members of image pickup device 10 have been incorporated, a part of adhesion between frame 4 and base board PC and other parts of adhesion are heated by a heating device such as an electric heater. The adhesive B are hardened thoroughly by this heating, and regular fixing is conducted (regular fixing process). After heating, hardening of the adhesive is completed, and thereby, assembly work of image pickup optical unit 20 is terminated.

Since the image pickup device 10 is structured so that positioning of lens frame 4 of the image pickup optical unit 20 and positioning of optical member 1 in the direction of an optical axis may be conducted easily in the present embodiment as stated above, it is possible to conduct independently a process to incorporate image sensor 2 and electric part 9 (first process) and a process to assemble image pickup optical unit 20 (second process). Therefore, it is not necessary to change contents of the second process in accordance with changes of respective parts and changes of incorporating process in the first process, and thereby, it is possible to save man-hour caused by changes in production process and to save, for example, cost for adjustment of facilities and equipment and for installation of new facilities.

Further, in the second process, all of the constituent members for image pickup optical unit 20 are incorporated from the upper portion, and therefore, the second process only can be conducted independently without being affected by the first process. Accordingly, even when types of base board PC are changed, image pickup optical unit 20 can be produced on the same line, thus, production cost and man-hour can be saved.

Further, in the method to fix lens frame 4 on base board PC in the present embodiment, the lens frame 4 can be positioned while it is brought into contact with positioning electric part 8 provided to be close to a square of an adhesion part of the lens frame 4 on base board PC. Therefore, it is possible to produce image pickup devices easily and accurately, by requiring neither a highly accurate machine for positioning nor man-hour and cost for arranging a mark for positioning on base board PC. It is further possible to position lens frame 4 rapidly, because it can be moved roughly in a relatively prompt operation until it is brought into contact with positioning electric part 8.

Further, by conducting temporal fixing process and regular fixing process in a part of adhesion between base board PC and lens frame 4, and by conducting incorporating process for optical member 1 and light-shielding plate 5 during a period between the temporal fixing process and the regular fixing process, it is easy to assemble and fixing time can be short, compared with regular fixing because there is less fear that the lens frame 4 is deviated from the base board PC in the course of incorporating. It is further possible to conduct adhesion process collectively in the course of regular fixing, resulting in reduction of time for an assembling process.

Further, since a height from the PC base board to a top end portion of the positioning electric parts 8 is greater than that from the PC base board to a top end portion of the image sensor 2, it is possible to produce by preventing that lower portion 4a of the lens frame 4 touches respective portions of image sensor 2 and wire W to damage them when fixing the lens frame 4 on the base board PC.

Positioning electric part 8 is a member which has so far been arranged on base board PC. It is therefore possible to utilize effectively the conventional member, without providing a member for positioning lens frame 4 specially. Further, when providing positioning electric part 8 on a clearance which has been present between lens frame 4 and image sensor 2, for example, the base board PC itself can be made small, and downsizing of image pickup device 10 and reduction of production cost are made possible.

Figure 8A:
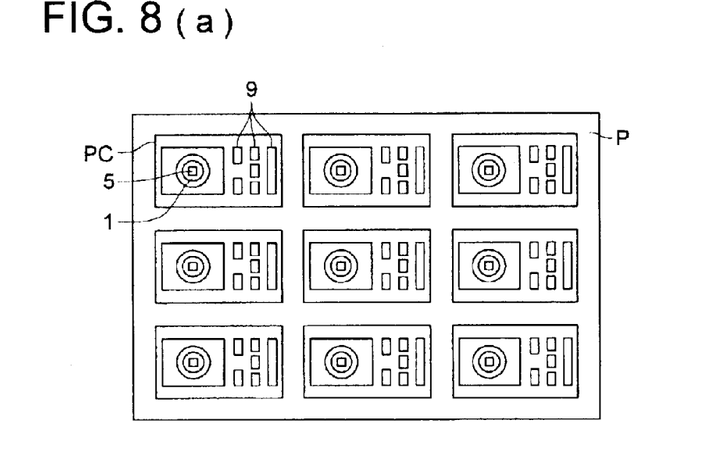
Figure 8B:
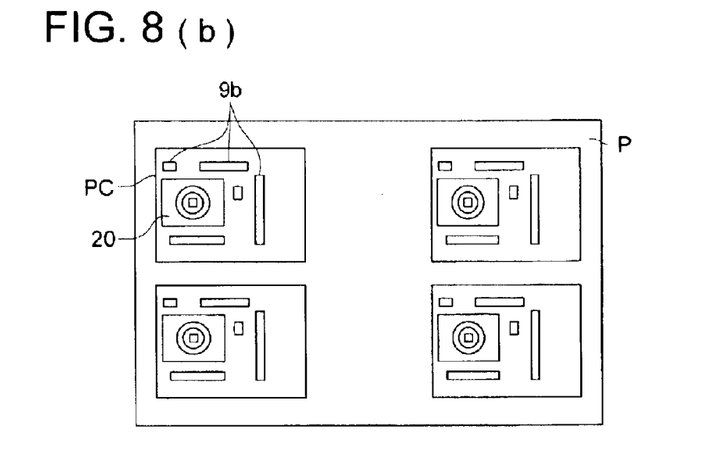
Figure 8C:
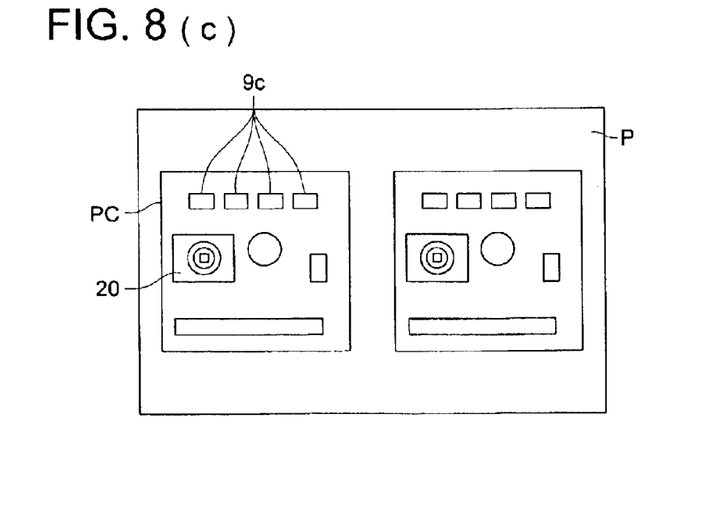

Though the invention has been explained above, referring to the embodiment, the invention should not be construed to be limited to the aforementioned embodiment, and it is naturally possible to modify or improve the invention. For example, though the structure wherein nine base boards PC are formed on one aggregate base board P was explained, base board PC and electric part 9 both constituting image pickup optical unit 20 are not limited to the aforesaid structure as shown in FIGS. 8(a)–8(c). Namely, in FIG. 8(a), nine base boards PC form one aggregate base board P as a production unit, which was explained in the present embodiment. In the same way, according to a producing method of image pickup device 10 relating to the invention, with respect to image pickup optical unit 20, four base boards PC or two base boards PC are formed in one aggregate base board P as shown in FIG. 8(b) or FIG. 8(c), assembling is also possible even on base board PC on which electric parts 9b and 9c which are different from those in FIG. 8(a) are arranged.

Further, though contact portion 1d of the optical member is made to be in contact with the top face of image sensor 2, it may also be brought into contact with base board PC, or with both of the image sensor 2 and the base board PC.

In addition, though the explanation has been given under the condition that respective parts of image pickup optical unit 20 are incorporated from the upper portion as one direction in the present embodiment, these respective parts may also be incorporated from, for example, the lower portion, provided that the direction from the lower portion is one that is perpendicular to photoelectric converting portion 2a of image sensor 2.

Further, in the present embodiment, image sensor 2 is of the structure of a bare-chip. However, it is also considered that the image sensor 2 is made to be of the durable structure by applying a protective member such as glass or film on the top surface or on the bottom surface of the image sensor. Further, base board PC may also be a flexible one without being limited to a hard one.

Though the explanation has been given under the condition of the structure where an image sensor of a CMOS type is used as image sensor 2 in the present embodiment, an image sensor of a CCD (Charge Coupled Device) type may also be used.

The image pickup device of the invention is considered to be capable of being incorporated in various objects such as a cellphone, a personal computer, PDA, AV equipment, a television set and a household appliance.

Figure 9A:
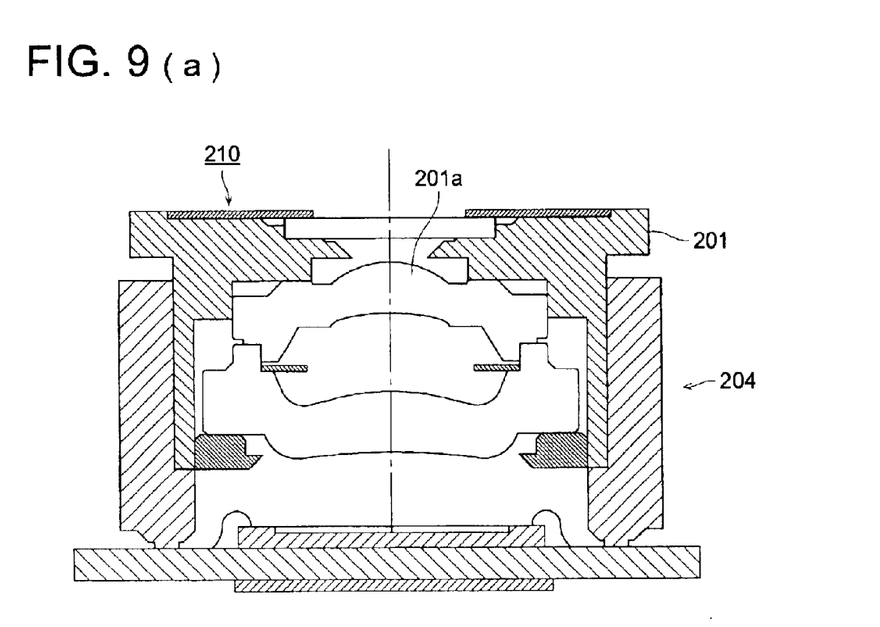
FIG. 9(a) is another example showing a schematic sectional view of an image pickup device that is composed of an optical member made up of two lenses and of a lens frame that engages with the optical member and FIG. 9(b) is another example showing a schematic sectional view of an image pickup device that is composed of an optical member made up of four lenses and of a lens frame that engages with the optical member.

FIG. 9(a) represents another Example showing a schematic sectional view of image pickup device 210 composed of optical member 201 whose lens portion 201a has two lenses and of lens frame 204 which engages with the optical member 201. In the same way, FIG. 9(b) represents still another Example showing a schematic sectional view of image pickup device 310 composed of optical member 301 whose lens portion 301a has four lenses and of lens frame 304 which engages with the optical member 301.

Figure 9B:
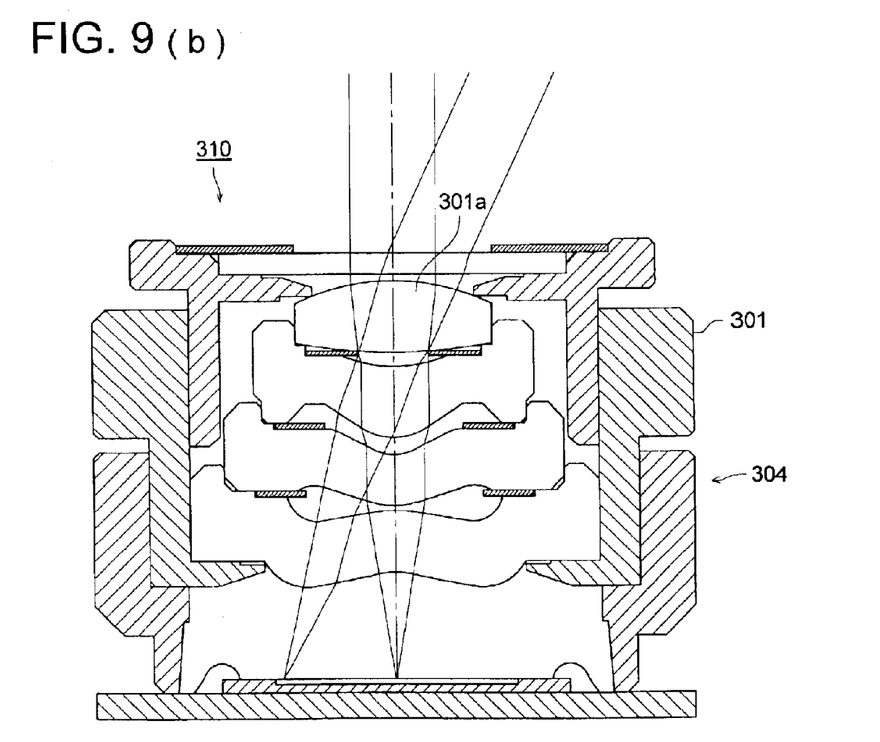

Hereupon, when a glass mold lens is used for the first lens which is closest to an object in each of FIGS. 9(a) and 9(b), it is necessary to establish a temperature for press working in mold pressing to be high in general, if the glass has its high glass transition point (Tg), which makes a metal mold for molding to be subject to wear and damage. As a result, the number of times for replacement of a metal mold for molding and the number of times of maintenances are increased, resulting in cost increase. When using a glass mold lens, therefore, it is preferable to use glass materials whose glass transition point is 400° C. or less.

It is preferable, from the viewpoint of dispersion and refractive index, to use a glass lens in an optical system for photographing, but it is necessary, in the optical system for photographing, to reduce the number of lenses by employing an aspherical lens, because white light is a prior condition. In this case, the aspherical lens is naturally manufactured by transferring the surface form through press molding by means of die-stamping, because it is impossible to manufacture through a lens smoothing and polishing method.

In this case, glass materials are heated to be subjected to die-stamping as a matter of course, and if a temperature in that case is high (in other words, the melting point is high, glass transition point is high), a die to be used for pressing is deteriorated quickly by heat (not durable for a large number of shots).

Further, when making a die, it is necessary to select a material for the die that is proof against high temperature, resulting in less choices for the materials.

In addition, in the case of working of die-stamping, a glass material is heated up to high temperature, and then, stamping is conducted, and after that, cooling is required, which makes a cycle time to be long.

If a glass material having low melting point is used, on the contrary to the foregoing, the problems stated above are solved. Namely, choices for selection of a material for the die are broadened, a die life is prolonged and a cycle time in the actual working can be shortened.

In the Structure (1), since the first process for mounting an image sensor and other electric parts on the base board and the second process for assembling the image pickup optical unit on the base board from one direction are independent from each other, even when changes in operations in the first process or changes in parts are made, the image pickup optical unit can be assembled in the same process, and neither preparation of new facilities for assembling nor readjustment is required. Therefore, it is possible to save labor and cost in production of image pickup devices.

To be more concrete, the second process can be carried out independently without being affected by the first process because the image pickup optical unit can be assembled from only one direction. Therefore, the image pickup devices can be produced on the same line independently of a type of the base board, which makes it possible to save labor and cost in production of image pickup devices.

In the Structure (2), the same effects as in Structure (1) are naturally obtained, and in particular, the outer frame member is fixed on the base board so that the image sensor may be covered in the outer frame member fixing process in the second process, the optical member is brought into contact with the base board or with the image sensor in the direction perpendicular to an image pickup surface of the image sensor in the optical member contact process and the pressing member is fixed on the outer frame member so that the optical member may be pressed by a prescribed force in the direction perpendicular to an image pickup surface of the image sensor in the pressing member fixing process, thus, assembling can be carried out in the direction perpendicular to an image pickup surface of the image sensor, which makes operations to be easy. Further, since the optical member is regulated in terms of movement in the direction of an optical axis by the pressing member to be fixed on the outer frame member, operations for positioning the optical member on the outer frame member are easy, thus, it is possible to produce highly accurate image pickup devices while making the first process and the second process to be independent each other.

In the Structure (3), the same effects as in Structure (2) are naturally obtained, and in particular, a movement of the optical member in the direction of rotation around an optical axis can be regulated, and therefore, highly accurate image pickup devices can be produced easily without fine adjustment such as positioning for the image sensor, because the optical member is provided with the interfitted portion that is engages with the outer frame member and is prevented from rotating around an optical axis as the center, the outer frame member is provided with an interfitting portion that is engaged with the interfitted portion, and the interfitted portion of the optical member is fitted in the interfitting portion in the direction perpendicular to the image pickup surface of the image sensor in the optical member contact process.

In the Structure (4), the same effects as in Structure (1) or Structure (2) are naturally obtained, and in particular, it is possible to use electric parts as indicators, when attaching the outer frame member on the base board in the second process, because the electric parts are attached at the location that is between the adhesion part of the base board and the image sensor and is closer to the adhesion part of the base board, in the first process. Therefore, the outer frame member can be mounted accurately without fine setting and adjustment for attaching it, which makes it possible to save labor and cost in production of image pickup devices.

In the Structure (5), the same effects as in Structures (2)–(4) are naturally obtained, and the outer frame member can be moved roughly in relatively prompt operations until it comes in contact with electric parts, because the outer frame member is fixed on the base board after being brought into contact with the electric parts in the outer frame member fixing process, thus it is possible to conduct positioning operations for the outer frame member promptly. Therefore, the outer frame member can be mounted accurately without careful setting and adjustment for operations to fix the outer frame member, which makes it possible to save cost and labor in production of image pickup devices.

In the Structure (6), the same effects as in Structures (2)–(5) are naturally obtained, and in particular, it is possible to harden an adhesive to a certain extent for temporal fixing and thereby to advance to the following assembly process without waiting until the adhesive is hardened thoroughly, when fixing the outer frame member on the base board, because a process to coat the adhesive composed of a resin of a compound hardening type having both a property to be hardened by ultraviolet radiation and a property to be hardened by a prescribed hardening means which is different from the ultraviolet radiation on an adhesion part between the outer frame member and the base board, a temporal fixing process to harden the adhesion part with ultraviolet radiation for temporal fixing, and a regular fixing process to harden by a prescribed hardening means to conduct regular fixing after conducting the optical member contact process and the pressing member fixing process. are conducted in the outer frame member fixing process. It is therefore possible to shorten a cycle time for production of image pickup devices, and thereby to improve productivity.

Further, it is possible to prevent that a position of the outer frame member is shifted between the optical member contact process and the pressing member fixing process, and to adjust again in the case of regular fixing process, which makes it possible to produce a highly accurate image pickup device.

What is claimed is:

1. A producing method for an image pickup device in which an image pickup optical unit that picks up an image of an object with an image sensor is provided on a base board, the producing method comprising the steps of:

mounting the image sensor and another electric part on the base board; and thereafter, assembling the image pickup optical unit on the base board, wherein the image pickup optical unit is provided with an outer frame member, and an optical member for converging light on the image sensor, and wherein the assembling step comprises:

sticking the outer frame member on the base board in a direction perpendicular to an image pickup surface of the image sensor so as to enclose the image sensor; and inserting the optical member in the outer frame member in the direction perpendicular to the image pickup surface of the image sensor.

2. The producing method of claim 1, wherein the assembling step is carried out from a direction of an optical axis of the image pickup optical unit, wherein the image pickup optical unit is further provided with a pressing member that presses the optical member, and wherein the assembling step further comprises:

bringing the optical member into contact with the base board or with the image sensor after the inserting step, and fixing the pressing member on the outer frame member or other member sticking the outer frame member in the direction perpendicular to the image pickup surface of the image sensor so as to press the optical member with a prescribed pressing force.

3. The producing method of claim 1, wherein the optical member is provided with an interfitted portion that is engaged with the outer frame member and is prevented from rotating around an optical axis of the optical member as the center, and the outer frame member is provided with an interfitting portion that is engaged with the interfitted portion of the optical member, and wherein the inserting step comprises making the interfitted portion of the optical member to be fitted in the interfitting portion of the outer frame member in the direction perpendicular to the image pickup surface of the image sensor.

4. The producing method of claim 1, wherein the mounting step comprises attaching at least one of the electric parts at a location that is between an adhesion part of the base board where the outer frame member is stuck and the image sensor, and is closer to the adhesion part of the base board.

5. The producing method of claim 1, wherein the sticking step is carried out after bringing the outer frame member into contact with the electric parts.

6. The producing method of claim 1, wherein the sticking step comprises:

coating an adhesive composed of a resin of a compound hardening type having both a property to be hardened by ultraviolet radiation and a property to be hardened by a prescribed hardening medium which is different from the ultraviolet radiation, on the adhesion part of the outer frame member and the base board;

temporally sticking the adhesion part by hardening the adhesive with ultraviolet radiation; and regularly sticking the adhesion part by hardening the adhesive by the prescribed hardening medium after conducting the inserting step.

* * * * *